US008099700B1

(12) United States Patent
Waller et al.

(10) Patent No.: US 8,099,700 B1
(45) Date of Patent: Jan. 17, 2012

(54) AUTOMATIC INTEGRATED CIRCUIT ROUTING USING SPINES

(75) Inventors: Mark Waller, Bristol (GB); Tim Parker, Bristol (GB); Mark Williams, Glos (GB); Jeremy Birch, Bristol (GB); Graham Balsdon, Glos (GB); Fumiako Sato, Tokyo (JP)

(73) Assignee: Pulsic Limited (GB)

( * ) Notice: Subject to any disclaimer, the term of this patent is extended or adjusted under 35 U.S.C. 154(b) by 282 days.

(21) Appl. No.: 11/838,726

(22) Filed: Aug. 14, 2007

Related U.S. Application Data

(63) Continuation of application No. 10/908,895, filed on May 31, 2005, now Pat. No. 7,257,797, and a continuation of application No. 11/530,613, filed on Sep. 11, 2006.

(60) Provisional application No. 60/577,850, filed on Jun. 7, 2004.

(51) Int. Cl.
*G06F 17/50* (2006.01)
(52) U.S. Cl. ...................................................... 716/126
(58) Field of Classification Search ................. 716/1, 12, 716/13, 15, 126
See application file for complete search history.

(56) References Cited

U.S. PATENT DOCUMENTS

| | | | |
|---|---|---|---|
| 4,615,011 A | 9/1986 | Linsker | |
| 4,673,966 A | 6/1987 | Shimoyama | |
| 4,777,606 A | 10/1988 | Fournier | |
| 4,782,193 A | 11/1988 | Linsker | |
| 4,811,237 A | 3/1989 | Putatunda et al. | |
| 4,815,003 A | 3/1989 | Putatunda et al. | |
| 4,852,015 A * | 7/1989 | Doyle, Jr. | 716/13 |
| 4,855,253 A | 8/1989 | Weber | |
| 4,965,739 A | 10/1990 | Ng et al. | |
| 5,072,402 A | 12/1991 | Ashtaputre et al. | |
| 5,187,671 A * | 2/1993 | Cobb | 716/12 |
| 5,272,645 A | 12/1993 | Kawakami et al. | |
| 5,353,235 A | 10/1994 | Do et al. | |
| 5,375,069 A | 12/1994 | Satoh et al. | |
| 5,500,804 A | 3/1996 | Honsinger et al. | |
| 5,541,005 A | 7/1996 | Bezama et al. | |
| 5,550,748 A | 8/1996 | Xiong | |
| 5,635,736 A | 6/1997 | Funaki et al. | |
| 5,637,920 A | 6/1997 | Loo | |
| 5,640,327 A | 6/1997 | Ting | |
| 5,646,830 A | 7/1997 | Nagano | |
| 5,650,653 A | 7/1997 | Rostoker et al. | |
| 5,689,433 A | 11/1997 | Edwards | |

(Continued)

OTHER PUBLICATIONS

Finch, A.C. et al., "A Method for Gridless Routing of Printed Circuit Boards", IEEE, Paper 32.2, 1985, pp. 509-515.

*Primary Examiner* — Suchin Parihar
(74) *Attorney, Agent, or Firm* — Aka Chan LLP

(57) ABSTRACT

A method and technique of routing interconnects of an integrated circuit providing improved routing quality. In an embodiment of the invention, the technique provides linear spine interconnect routing. In memory array blocks, such as in DRAM and SRAM memory designs, connected pins are generally separated by large distances in a first direction and small distances in a second direction, or a spine or channel region. A route area is defined within the spine region. In one embodiment, obstacles in the route area are identified and corresponding forbidden areas are demarcated. The linear spine interconnect is routed in the first direction within the route area while avoiding the forbidden areas. Pins are connected to the spine interconnect by stitching interconnects. Stitching interconnects are generally routed in the second direction.

32 Claims, 10 Drawing Sheets

U.S. PATENT DOCUMENTS

| | | | |
|---|---|---|---|
| 5,723,908 A | 3/1998 | Fuchida et al. | |
| 5,757,089 A | 5/1998 | Ishizuka | |
| 5,784,289 A | 7/1998 | Wang | |
| 5,790,414 A * | 8/1998 | Okano et al. | 716/13 |
| 5,801,385 A | 9/1998 | Endo et al. | |
| 5,801,959 A | 9/1998 | Ding et al. | |
| 5,811,863 A | 9/1998 | Rostoker et al. | |
| 5,822,214 A | 10/1998 | Rostoker et al. | |
| 5,880,969 A | 3/1999 | Hama et al. | |
| 5,889,329 A | 3/1999 | Rostoker et al. | |
| 5,980,093 A | 11/1999 | Jones et al. | |
| 6,111,756 A | 8/2000 | Moresco | |
| 6,150,193 A | 11/2000 | Glenn | |
| 6,219,823 B1 | 4/2001 | Hama et al. | |
| 6,260,183 B1 | 7/2001 | Raspopovic et al. | |
| 6,262,487 B1 | 7/2001 | Igarashi et al. | |
| 6,263,475 B1 | 7/2001 | Toyonaga et al. | |
| 6,282,693 B1 | 8/2001 | Naylor et al. | |
| 6,301,686 B1 | 10/2001 | Kikuchi et al. | |
| 6,301,693 B1 | 10/2001 | Naylor et al. | |
| 6,307,256 B1 | 10/2001 | Chiang et al. | |
| 6,316,838 B1 | 11/2001 | Ozawa et al. | |
| 6,323,097 B1 | 11/2001 | Wu et al. | |
| 6,324,674 B2 | 11/2001 | Andreev et al. | |
| 6,324,675 B1 | 11/2001 | Dutta et al. | |
| 6,349,403 B1 | 2/2002 | Dutta et al. | |
| 6,408,427 B1 | 6/2002 | Cong et al. | |
| 6,412,097 B1 | 6/2002 | Kikuchi et al. | |
| 6,448,591 B1 | 9/2002 | Juengling | |
| 6,480,993 B1 | 11/2002 | Suto et al. | |
| 6,480,996 B1 | 11/2002 | Aji et al. | |
| 6,507,941 B1 | 1/2003 | Leung et al. | |
| 6,510,545 B1 | 1/2003 | Yee et al. | |
| 6,516,455 B1 | 2/2003 | Teig et al. | |
| 6,526,555 B1 | 2/2003 | Teig et al. | |
| 6,543,043 B1 | 4/2003 | Wang et al. | |
| 6,553,338 B1 | 4/2003 | Buch et al. | |
| 6,564,366 B1 | 5/2003 | Marchenko et al. | |
| 6,598,215 B2 | 7/2003 | Das et al. | |
| 6,645,842 B2 | 11/2003 | Igarashi et al. | |
| 6,662,348 B1 | 12/2003 | Naylor et al. | |
| 6,671,859 B1 | 12/2003 | Naylor et al. | |
| 6,711,727 B1 | 3/2004 | Teig et al. | |
| 6,734,472 B2 | 5/2004 | Ho | |
| 6,895,567 B1 | 5/2005 | Teig et al. | |
| 6,931,610 B1 * | 8/2005 | Buch et al. | 716/113 |
| 7,100,135 B2 | 8/2006 | Meyer et al. | |
| 7,603,641 B2 * | 10/2009 | Lin | 716/120 |
| 2001/0004763 A1 | 6/2001 | Kato | |
| 2001/0009031 A1 | 7/2001 | Nitta et al. | |
| 2002/0069397 A1 | 6/2002 | Teig et al. | |
| 2002/0113619 A1 * | 8/2002 | Wong | 326/41 |
| 2003/0025205 A1 | 2/2003 | Shively | |
| 2004/0250230 A1 | 12/2004 | Itou et al. | |
| 2005/0172252 A1 * | 8/2005 | Cheng et al. | 716/10 |
| 2005/0240893 A1 | 10/2005 | Teig et al. | |
| 2006/0080630 A1 * | 4/2006 | Lin | 716/11 |
| 2006/0095872 A1 * | 5/2006 | McElvain et al. | 716/1 |
| 2006/0288323 A1 * | 12/2006 | Birch | 716/12 |
| 2006/0294488 A1 * | 12/2006 | Waller | 716/13 |

* cited by examiner

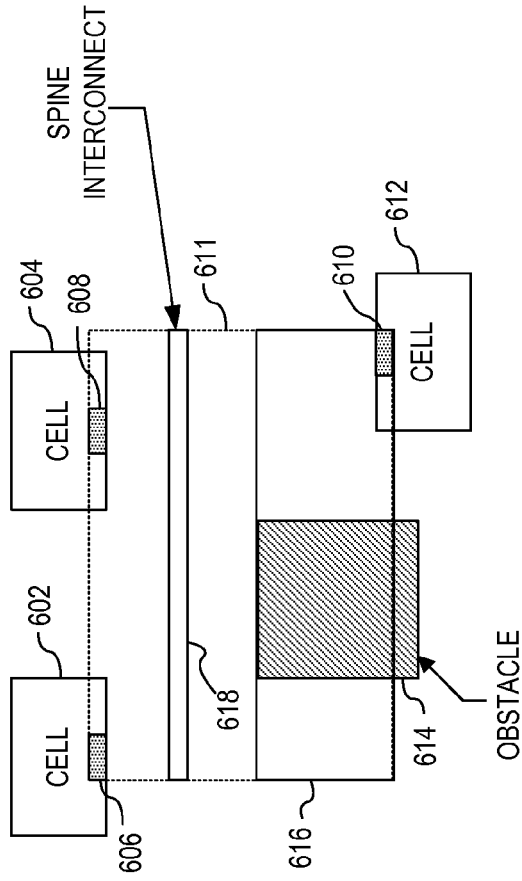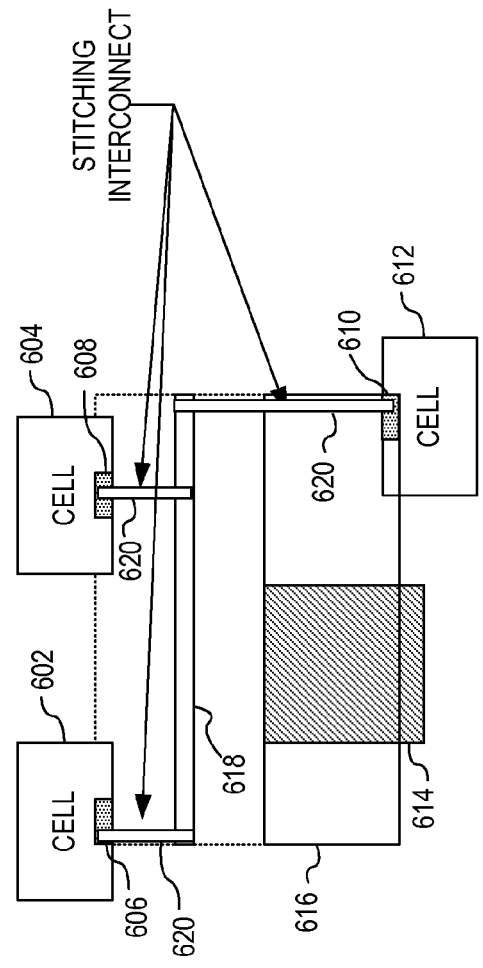
Figure 6(c)
Figure 6(d)

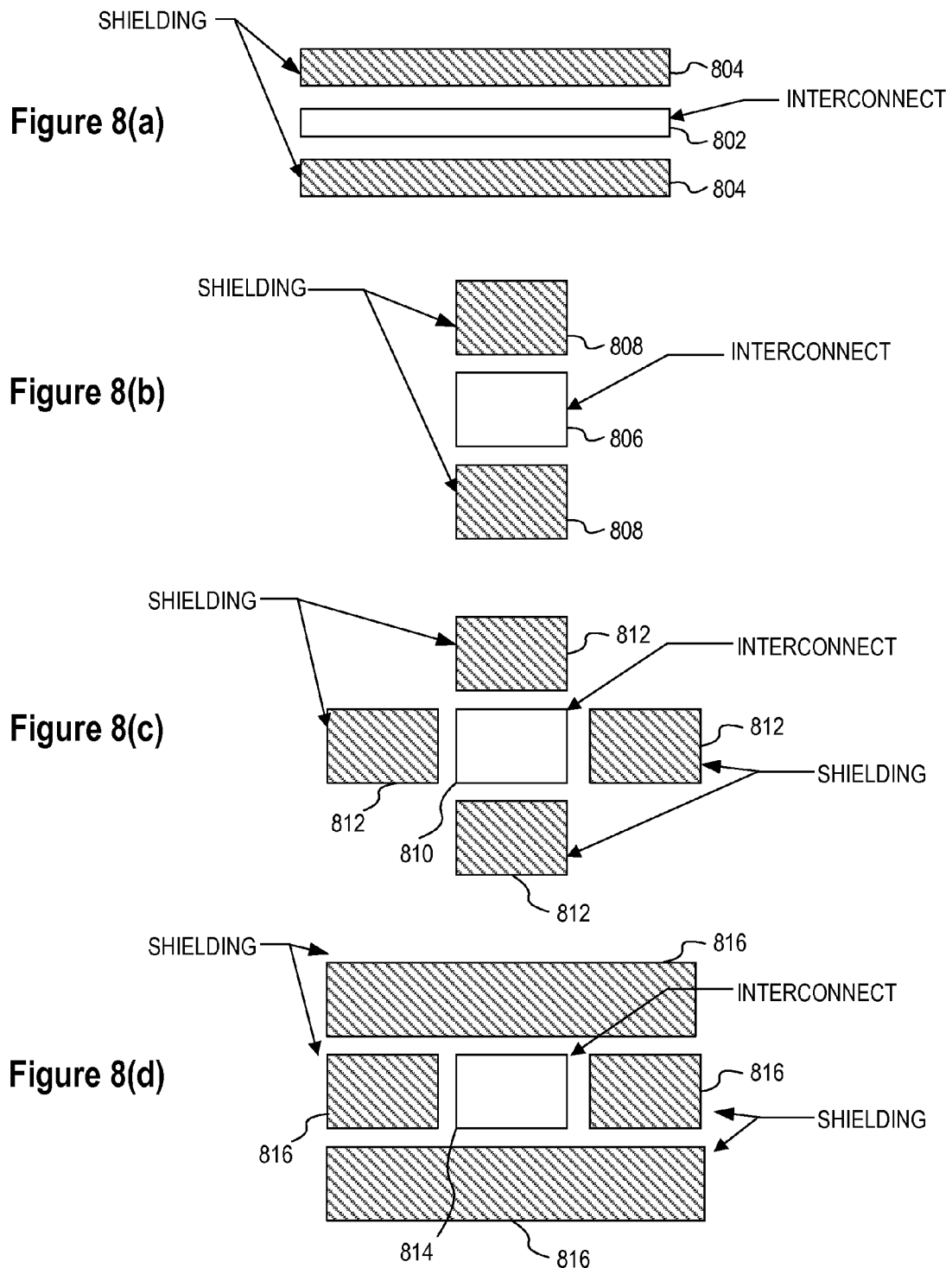

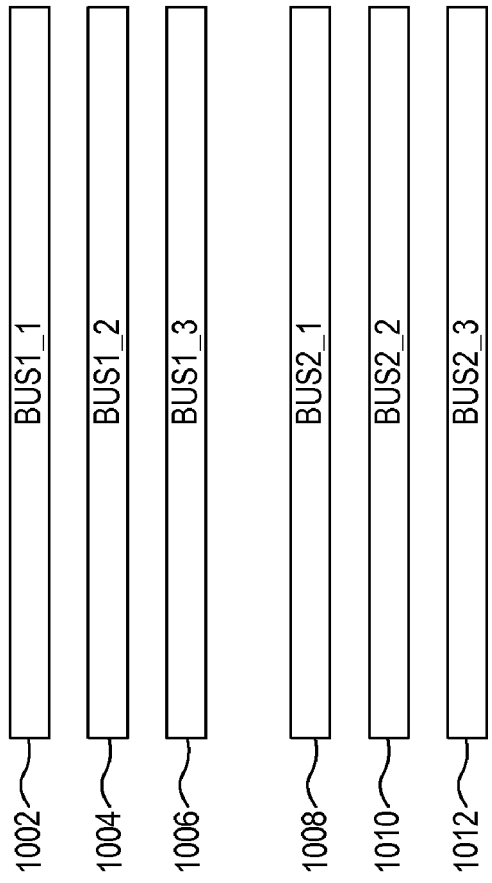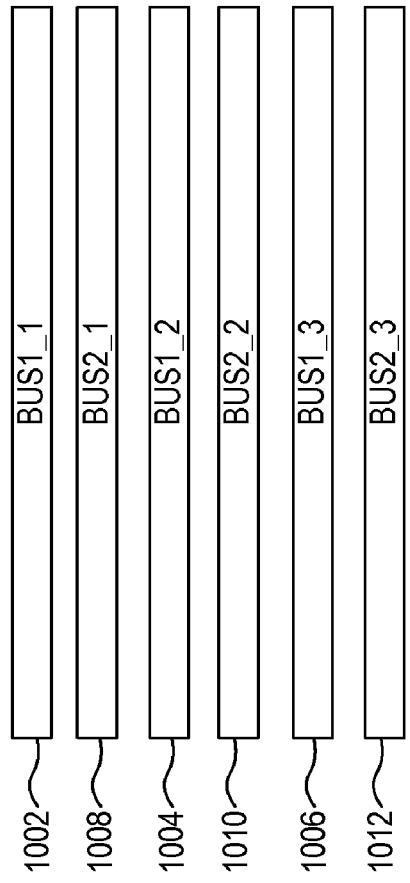
Figure 10(a)
Figure 10(b)

AUTOMATIC INTEGRATED CIRCUIT ROUTING USING SPINES

CROSS-REFERENCE TO RELATED APPLICATIONS

This application is a continuation of U.S. patent application Ser. No. 10/908,895, filed May 31, 2005 (now U.S. Pat. No. 7,257,797, issued Aug. 14, 2007), which claims the benefit of U.S. provisional patent application 60/577,850, filed Jun. 7, 2004, and U.S. patent application Ser. No. 11/530,613, filed Sep. 11, 2006, which are incorporated by reference along with all other references cited in this application.

BACKGROUND OF THE INVENTION

The present invention relates to the field of electronic design automation (EDA) or computer aided design (CAD) software and, more particularly, to techniques for placing devices and routing interconnects in integrated circuits.

Integrated circuit technology is a marvel of the modem age. Integrated circuits are also sometimes referred to as "chips." Integrated circuits are used in many applications such as computers, consumer electronics, networking, and telecommunications. There are many types of integrated circuits including microprocessors, microcontrollers, application specific integrated circuits (ASICs), gate arrays, programmable logic devices (PLDs), field programmable gate arrays (FPGAs), dynamic random access memories (DRAMs), static random access memories (SRAMs), erasable programmable read only memories (EPROMs), electrically erasable programmable read only memories (EEPROMs), and Flash memories. Integrated circuits may also include combinations of one or more of these specific types of integrated circuit. For example, an ASIC may include a portion of an embedded DRAM.

Integrated circuit technology continues to rapidly advance. Modern integrated circuits may contain hundreds, thousands, or even millions of individual devices (e.g., transistors, resistors, diodes, capacitors, and others) or cells. Such designs are much too large for an integrated circuit designer to manage effectively manually. For example, an integrated circuit design may have hundreds or thousands of inputs and outputs that need to be routed. To route interconnect manually between the inputs and outputs, it would take an integrated circuit designer an inordinate amount of time.

Therefore, automation tools are needed to make easier and expedite the task of designing an integrated circuit. It is important to be able to produce a circuit design and layout meeting or exceeding the design objectives before the integrated circuit is fabricated. This will help avoid a costly redesign to correct errors or improve performance to meet specifications. Techniques are needed to provide high-performance circuit designs and circuit layouts.

Speed in the design process is also an important consideration for an EDA system. Time-to-market pressures demand design tools provide rapid, accurate results, especially for large complex designs. By obtaining results more quickly, designers can make more meaningful decisions on design tradeoffs by not having to wait for days to even weeks to obtain accurate results.

As a component of an EDA system, automatic interconnect routers, or routers, have been developed to automate the placement of interconnects in integrated circuit devices. Routers generate the geometry of the interconnects to connect pins or a network of pins together. Traditional routers typically include a coarse routing process and a fine routing process. The coarse router provides a general path for interconnect routing. The fine router provides the actual interconnect segments and their geometries. The fine router creates interconnect routes that are "clean." Clean refers to making routes that do not have design rule violations (such as meeting timing, crosstalk, and antenna effect specifications) and do not overlap other structures (such as other interconnect routes and obstacles).

It is desirable to provide better or improved routing quality when using an automatic router. Better routing quality refers to an improved routing pattern or design in order to enhance signal propagation characteristics, such as reducing noise, reducing signal propagation time, and other signal characteristics. In particular, traditional routers do not necessarily generate optimal linear interconnects. For example, a traditional router often produces interconnect with many jogs and bends, which do not facilitate a fast signal path. Linear interconnects are desirable so as to improve integrated circuit performance, reduce resistance and capacitance of interconnects, reduce die size, and improve circuit layout organization.

As a result of the shortcomings of traditional automatic routers, integrated circuit designers manually reroute interconnects to increase linear interconnects. However, manual rerouting is time consuming, especially for large designs, may introduce design rule violations, and the results of manual rerouting may not be optimal.

As can be seen, techniques are needed to route interconnects of integrated circuits in an optimal way for improving designs, especially improving the routing quality and speed of automated routing.

BRIEF SUMMARY OF THE INVENTION

The present invention provides a technique for routing interconnects of integrated circuits, and is broadly applicable to many types of integrated circuit including custom, semicustom, and high-performance integrated circuits. In an embodiment, the technique of the present invention is embodied in a computer software program that is to be executed by a computer system. In particular, the technique facilitates improved routing quality of interconnects and has fast execution times. The technique is applicable to small circuits having relatively few components and is especially suited for integrated circuits having hundreds, thousands, or millions of components.

A spine router is a specialized application for routing connectivity in long, relatively thin areas or routing areas with high aspect ratios, such as a ratio or 4:1 or greater. These long, relatively thin areas are sometimes referred to in this application as a spine, channel, pipeline, or canal. An example of a routing area with a high aspect ratio is an area found between peripheral logic devices of memory array blocks in memory devices or devices with embedded memory. Another example of a routing area with a high aspect ratio is an area found in datapath design, such as in an arithmetic logic unit (ALU) or floating point processing unit (FPU) or a processor or embedded processor. Datapath designs will have these high aspect area routing areas as the number of width of the processor increase, such as 64-bit processors, 128-bit processors, and so forth.

Long, relatively thin routing areas typically contain connections between pins (sometimes referred to as connectors or subpins) separated by large distances in one direction and small distance in the other. The technique lays down a single spine interconnect per net that extends in the long direction between the two outermost pins on the net. A net is a set of coupled pins. Then the pins are "stitched" onto the spine interconnect. The pins are connected by a straight interconnect to the spine interconnect if possible. Otherwise, they are connected by an interconnect with a minimum cost-based deviation from a straight interconnect. The placement of the spines are made so as to minimize the overall connection distance and corresponding signal delay. Although a spine router is well suited for routing in a spine, it can be used to route interconnects anywhere in a design, including areas outside the spine.

In an embodiment of the invention, a method for routing at least one interconnect of an integrated circuit is provided. At least two pins to couple are identified. A route area is calculated. The route area extends a distance in a first direction to comprise positions in the first direction of the at least two pins. A spine interconnect is routed to extend in the first direction an entire length of the route area in the first direction. A plurality of stitching interconnects are routed in a second direction to couple each of the at least two pins to the spine interconnect. The second direction is orthogonal to the first direction. In this embodiment, the method may further include determining if at least one forbidden area is located within the route area. The at least one forbidden area extends in the first direction the entire length of the route area in the first direction and includes at least one obstacle (i.e., an area on specific layers that presents a restriction to routing or placement). Routing the spine interconnect avoids the at least one forbidden area.

In another embodiment, stitching interconnects may be automatically rerouted in the first direction and second direction to avoid obstacles. Alternatively, one or more edges of the routing area may coincide with one or more edges of chips or circuit elements.

In an embodiment of the invention, the spine interconnect may be position in the second direction to reduce an average length of the stitching interconnects. For example, the position of the spine interconnect in the second direction can be the weighted average position in the second direction of the connected pins in the route area or, alternatively, the closest position to the weighted average position outside of a forbidden area.

In an alternative embodiment, N pins are identified to couple. A rectangular route area that includes the positions in a first direction of the N pins is calculated. A determination is made as to whether at least one forbidden area is located within the route area. A spine interconnect is routed extending in the first direction an entire length of the route area in the first direction. Routing of the spine interconnects is outside of the at least one forbidden area. N stitching interconnects are routed in a second direction to couple each of the N pins to the spine interconnect. The at least one forbidden area is as a rectangular area that includes at least one obstacle and extends in the first direction an entire length of the route area in the first direction. The first direction is orthogonal to the second direction.

The spine interconnect may be positioned in the second direction to reduce an average length of the N stitching interconnects. For example, the position of the spine interconnect in the second direction can be the quotient of (i) the sum of the positions of the N pins in the second direction and (ii) N or, alternatively, the closest position to such quotient outside of any forbidden area.

In yet another embodiment of the present invention, a computer program product stored on a computer-readable storage medium for routing a plurality of nets of an integrated circuit is provided. The computer program product includes: code for identifying pins to couple for each net; code for calculating a route area for each net to comprise positions in a first direction of the pins for such net; code for determining for each route area if at least one forbidden area is located within the route area; code for routing outside of the at least one forbidden area a plurality of spine interconnects extending in a first direction the entire length of each corresponding route area in the first direction; and code for routing a plurality of stitching interconnects in a second direction to couple each of the pins to the corresponding spine interconnect. The at least one forbidden area being an area to include at least one obstacle and extending in the first direction an entire length of the corresponding route area in the first direction.

In another embodiment, a method of displaying a route area for spine routing is provide. A circuit layout having a spine area is displayed on a display device. A rectangular box is drawn to encompass at least a portion of the spine area, the portion includes at least two pins to couple. The circuit layout along with the rectangular box is displayed on the display device.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 6(a), 6(b), 6(c), and 6(d) shows, as an example, steps for routing interconnects in a spine area for a single net according to an embodiment of the invention.

FIGS. 8(a), 8(b), 8(c), and 8(d) show exemplary embodiments of automatic routing of shielding.

FIGS. 10(a) and 10(b) illustrate automatic interleaving of bus interconnects according to an embodiment of the invention.

DETAILED DESCRIPTION OF THE INVENTION

Figure 1:
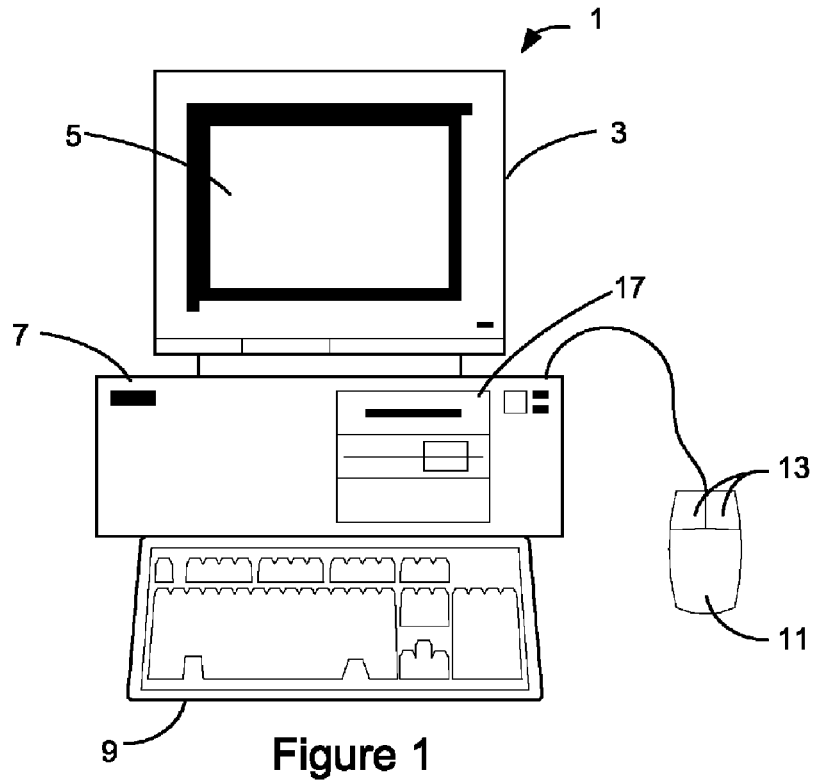
FIG. 1 shows a system of the present invention for performing electronic circuit design, including spine interconnect routing.

FIG. 1 shows an electronic design automation (EDA) system of the present invention for designing an electronic circuit or integrated circuit, including automatic shape-based routing of interconnect in spines for integrated circuit design. In an embodiment, the invention is software that executes on a computer workstation system, such as shown in FIG. 1. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor, memory, mass storage devices 17, and the like. Mass storage devices 17 may include mass disk drives, floppy disks, Iomega ZIP™ disks, magnetic disks, fixed disks, hard disks, CD-ROMs, recordable CDs, DVDs, recordable DVDs, flash and other nonvolatile solid-state storage, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, CD-ROM, or DVD).

Figure 2:
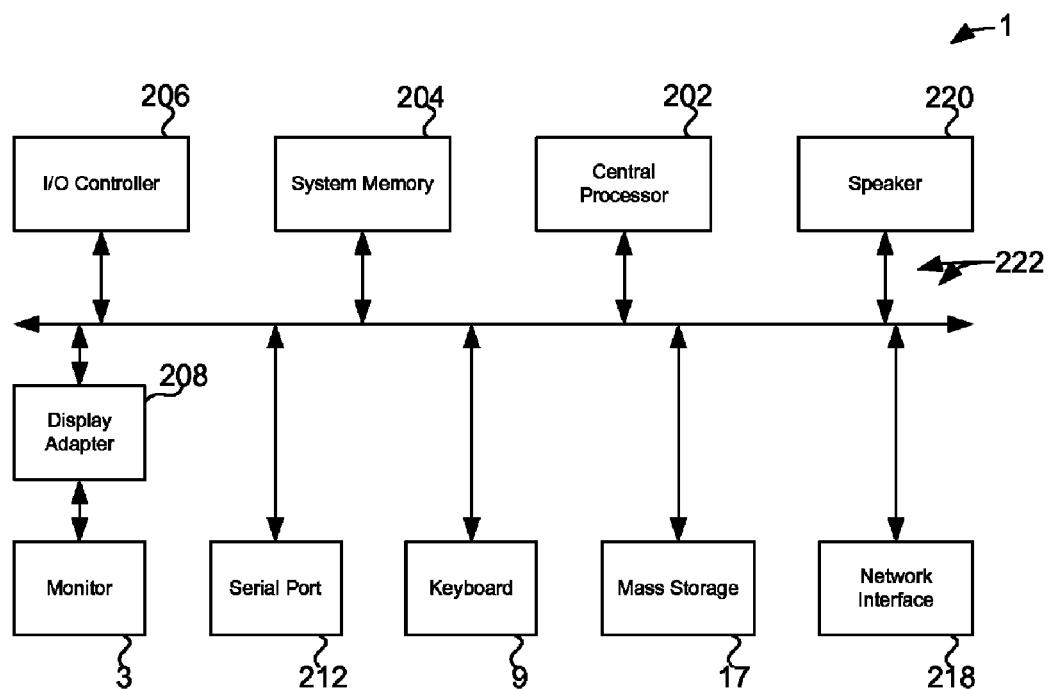
FIG. 2 shows a simplified system block diagram of computer system 1 used to execute the software of the present invention.

Further, FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

Arrows such as 222 represent the system bus architecture of computer system 1. However, these arrows are illustrative of any interconnection scheme serving to link the subsystems. For example, speaker 220 could be connected to the other subsystems through a port or have an internal direct connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks), SAS, SPSS, and Java. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, UNIX, or Sun OS. Other operating systems may be used.

Furthermore, the computer may be connected to a network and may interface to other computers using this network. For example, each computer in the network may perform part of the task of the many series of spine routing steps in parallel. Furthermore, the network may be an intranet, internet, or the Internet, among others. The network may be a wired network (e.g., using copper), telephone network, packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, and 802.11i, just to name a few examples). For example, signals from a computer may be transferred, at least in part, wirelessly to components or other computers.

Figure 3:
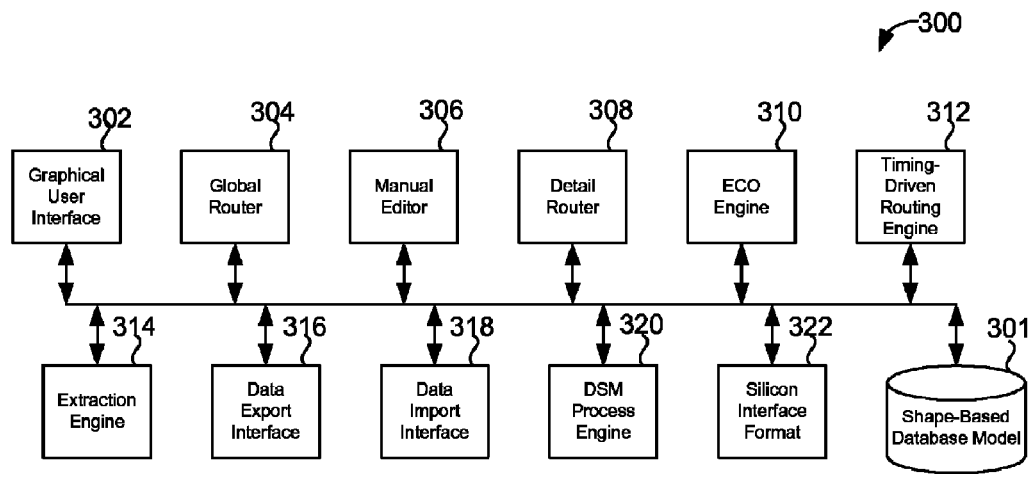
FIG. 3 shows a simplified functional block diagram of an exemplary EDA system incorporating aspects of the present invention.

FIG. 3 shows a simplified functional block diagram of an exemplary EDA system 300 incorporating aspects of the present invention. The EDA system includes a number of software tools, any of which may access a shaped-based database model 301 containing an integrated circuit design, or one or more portions of an integrated circuit design. The EDA system provides such tools as a graphical user interface 302, global router 304, manual editor 306, detail router 308, engineering change order (ECO) engine 310, timing-driven routing engine 312, extraction engine 314, data export interface 318, DSM process engine 320, and silicon interface format 322. An EDA system may include any number of the system tools shown in FIG. 3, and in any combination. Further, the EDA system may include additional tools not shown in FIG. 3.

An EDA system may be a grid-based system or shape-based system. Techniques of the present invention may be applied to a gridded or shape-based EDA system. A grid-based system relies heavily on the concept of a grid and routing grids. Gridded modeling, however, becomes difficult to implement successfully as the routing and feature sizes become smaller. The amount of data increases according to a square law, which means that tasks become increasingly more computationally complex and time-consuming as the amount of data increase. As feature sizes in integrated circuits continue to shrink, more features or geometries may be fitted into the same unit area of an integrated circuit. Therefore, it is important for an EDA system to handle increasingly complex integrated circuits and provide output or results quickly.

The techniques of the invention are especially suited for a shaped-based system, which may also be referred to as a gridless system. A shape-based system has no defined cell size. Each cell, or expansion area, is as large as possible. In brief, a shape-based system can expand edges, which means that an edge of an enclosing rectangle (or other polygon) may be expanded in the direction of the edge as far as desired until the edge finds an obstacle. This may be referred to as a "flood" operation. The rectangle may be representative of any polygon of the integrated circuit, such as a net, contact, via, transistor gate, or transistor active area. Blocked edges are edges that cannot be extended because they are blocked by a perimeter of another rectangle, such as another segment, net, or obstacle. Once an obstacle is encountered, then a shape-based approach floods around the obstacle—making a ninety degree or other angle (any angle may be used) turns as needed to route around the obstacle.

Chip design, be it analog, custom or digital, will increasingly suffer from timing and signal integrity issues, and in particular crosstalk, as geometries continue to decrease and ever more fine wires are introduced. Gridded solutions are not flexible enough to resolve these issues, let alone achieve a high rate of routing completion. A high performance timing and crosstalk-driven routing solution will become a mandatory requirement in physical design. The grid-based approach offers fast routing but requires customization to handle off-grid connections and is inefficient for post-route timing and signal integrity optimizations. When net widths and spacings must be changed to reduce resistance or cross-talk, grid-based approaches waste space by moving nets to the next available grid and waste time by resorting to rip-up and re-route techniques if a move to the next available grid is not possible. Gridded systems are not good at irregular intervals, irregular spacings, or routing things that do not fit onto a regular grid. The gridless approach easily handles off-grid connections and is efficient for post-route optimizations. In a shape-based or gridless system, the layout may be a gridless layout, which means there is no grid which structures or polygon of the layout are associated with.

In an embodiment, the structure of database 301 facilitates shape-based operations. For example, a structure of this database may include an obstacle tree having nodes and leaves containing holds the obstacles of an integrated circuit. This tree structure permits rapid determination of where obstacles are when doing operations on the database, such as routing nets.

An specific example of an electronic design automation system is the Lyric Physical Design Framework™, made by Pulsic Limited. Lyric is a high performance auto-interactive IC physical design solution for analog, custom, digital, mixed-signal, embedded DRAM or SRAM, and system-on-chip (SoC) design. The system incorporates solutions for placement, routing, ECO, timing closure, signal integrity, and power routing. Another example of an EDA system is the Prelude Physical Design Framework™, also made by Pulsic. Prelude is an ultra high capacity, high performance IC physical design solution for very large digital/ASIC designs, running into millions of nets and cells. Prelude incorporates solutions for placement, routing, and ECO, powered by a scalable architecture, using a true distributed computing environment.

In FIG. 3, the EDA system 300 includes one or more of the components discussed below, in any combination. One skilled in the art will recognize that one or more of components shown in FIG. 3 may not be required to practice specific aspects of present invention. For example, when extraction engine 314 is omitted from system, the system could still perform spine routing of interconnection, but without RC extraction capabilities.

A graphical user interface 302 provides users a graphical interface in which to perform operations on the integrated circuit design. For example, the user can view the integrated circuit using the graphical interface. The user may use the mouse and cursor to select a particular polygon or feature, such as a net. The user may expand or zoom into areas of the integrated circuit design.

A global router 304 is an automatic routing engine that routs interconnects of the integrated circuit, thus enabling large designs to be routed more rapidly and completely. The global router may also provide visual and quantitative analysis of the congestion in the design by highlighting problem areas that can be fixed by incremental adjustments to the placement or floor plan. The global router is sometimes referred to as a coarse router because it provides generally the routes for the interconnect, and may work in conjunction with a detail router 308 (discussed below) to place the actual geometries of the interconnects.

A manual editor 306 is a shape-editing suite for creating or editing wires, metal, keep-outs, routing areas, and the ability to partition a design into smaller areas. These areas can then be worked upon individually and can be recombined at a later stage to complete the design. Full on-line design rule checking (DRC) ensures that manual operations are completed error-free first time. Tools may automatically push-aside existing wiring to make way for new wires and semi-automatic routing tools can quickly close down troublesome nets by allowing the user to guide the routing engine around complex areas of the design.

The detail router 308 is an automatic router that completes the wiring in a design by determining the specific routes for each interconnect. The detail router may complete a portion of the wiring for a design, such as for sections or specified cells of the design, or may complete all the wiring of the design. The detail router may route starting from scratch or from partially completed routing. In an implementation, the global router determines the general routes for the interconnect, and the detail router takes this routing information from the global router and puts in the specific geometries.

An ECO engine 310 provides a capability to handle late stage engineering change option (ECO) changes. Every element of the design should be modeled incrementally, thus eliminating the need to ever restart the physical design, no matter what changes may need to be made from upstream or downstream processes in the design. ECO engine capabilities can include the ability to shove or push cells aside to make space for new or relocated instances, and the ability to drop groups of components and automatically find legal placement sites for them, minimizing the disruption to the design. When pushing or pulling cells, the wires remain connected to the cells and the wires lengthen, shorten, and move as needed, if possible, to keep the connections. The detail router can then repair any violating interconnects and stitch-up any newly introduced interconnects, with minimum impact, ensuring circuit stability is never compromised.

A timing-driven routing engine 312 provides timing analysis of interconnects. Used in concert with the detail router, the timing-driven routing engine can determine the path of least delay for critical nets. Furthermore, the timing-driven routing engine, in concert with an extraction engine, can actively select a longer path with a lower associated delay (e.g., due to lower capacitance) in preference to a shorter but slower route.

An extraction engine 314 is provided. Utilizing a unified, high speed RC extraction engine, the crosstalk functionality accurately calculates the coupling between victim and aggressor signals. This same technology is then used to identify potential problems, and automatically implements a DRC correct solution without changing the path of the signal unnecessarily. In addition, signal-to-signal (or within and between classes of signals) spacing rules can be applied, and fully controllable automatic shielding can be used to protect particularly sensitive signals. The user is provided with unprecedented control over the resistance and capacitance in the signal path. Again, using the advanced built-in RC extraction technology, the user can separately control path resistance and capacitance, which is particularly useful for analog and mixed signal design.

In an implementation, the global router and detail router are linked to the extraction engine. So, for example, when running, the global router or detail router, or both, can call the extraction engine to obtain RC extraction information. The global router, detail router, or both, may use the RC extraction information when creating the interconnect routes. For example, the detail router may obtain RC extraction info from the RC engine in order determine whether an interconnect route meets current density rules, and widen the interconnect width as needed.

In a specific embodiment, the Lyric internal RC extraction driven constraints manager has been enhanced to ensure matching on a per-layer basis as well as the whole net or subnet. There is an increasing requirement in today's designs to match length, time, resistance and capacitance across nets on a per-layer basis. This ensures total net constraints are met as before but also guarantees designated nets can match on a per-layer basis.

The tightly coupled, high-speed RC extraction engine is used both during routing (global router or detail router, or both) and for post-routing extraction to reach timing closure in record time. Integrated timing analysis and curative features enable the management of delay within the design; the matching of delays within and between multiple nets; the sharing of delay between many nets in a signal path; and reducing the delay in critical nets by minimizing resistance and capacitance. Intelligent lengthening increases the delay of the faster nets, preventing shoot-through.

The detail router can address current density issues in analog design, to help achieve an optimum routing result for the entire design, and save valuable design time. The current information which is used to drive this current density functionality may come from, for example, a front-end schematic engine or simulation engine. The router can automatically route a net at varying widths to guarantee sufficient track widths at every point in the topology of the net to carry all current requirements. DRC and process checking tools can locate any insufficient width areas that may exist in any routing, including automatically generated routing, manual routing, and imported prerouting.

A data export interface 316 is provided so data of the EDA system 300 may be exported for other processes. For example, output from the EDA system may be passed through the export interface to other EDA systems or software tools provided by other manufacturers. The export interface would provide output in a form, format, or structure, acceptable by process or software tool which is being exported to.

A data import interface 318 provides the means to import data, such as a circuit layout, netlist, or design constraints. The data to be import may be in various formats including data saved from other EDA systems or software tools. In addition, the source of the data may be a database, floppy drive, tape, hard disk drive, CD-ROM, CD-R, CD-RW, DVD, or a device over a communication network. Some examples of import formats include text, ASCII, GDSII, and LEF/DEF.

A DSM process engine 320 is provided. The DSM process engine does design rule checking (DRC). Design rule checking locates and highlights where a design is breaking process design rules. For example, a design rule is the minimum spacing between metal lines (i.e., geometries on a specific layer). A design rule may be the minimum width of a metal line. A design rule may be a minimum polysilicon-to-diffusion spacing. There are many other design rules for a typical process. Some design rules are for checking geometries within a single layer, and some design rules are for checking geometries of two or more layers.

A silicon interface format 322 is provided, which in a specific implementation is an ASCII database format. However, in other implementations, other silicon interface formats may be used.

A user may design an integrated circuit using a system such as shown in FIG. 3. A representative flow for designing an integrated circuit is outlined in steps 1 to 7 below in table A. Step 5 is further subdivided into three substeps.

TABLE A

Integrated Circuit Design Flow

1. Provide Circuit Specification
2. Create Circuit Design
3. Generate Netlist
4. Simulate Performance and Verify Functionality of Circuit Design
5. Generate Layout
5a. Layout Devices
5b. Connect Devices
5c. Connect Blocks of Circuitry
6. Physical Verification and Design Checking
7. Create Masks
8. Fabricate Integrated Circuit Although the steps above are listed in a specific order, the steps may take place in any order, as desired and depending on the specific application. These are general steps that may be applied to designing an integrated circuit including custom, a gate array, standard cell, field programmable logic, microprocessor, digital signal processor, microcontroller, system-on-a-chip (SOC), memory, ASIC, mixed signal, analog, radio frequency (RF) or wireless, and others. There may be additional or other steps, which may replace one or more above steps. Certain steps may be repeated. For example, after generating a layout for a circuit design, the step of simulating performance and verifying functionality may be performed again. This time, the parasitics and RC considerations from the layout cannot be backannotated into the netlist or circuit design, and the design simulated again. The results of this simulation will presumably be more accurate because more precise information is provided.

In step 1 of the flow, a circuit specification is provided. This is a specification or description of what the integrated circuit or circuit will do, and what the performance will be. For example, the integrated circuit may be a memory integrated circuit with particular address input pins and input-output (I/O) pins. Integrated circuit performance may be quantified terms in AC and DC performance. For example, AC performance refers to propagation delays, maximum clock frequency, clock-to-output delay, hold time, and other similar parameters. DC performance refers to maximum supply current, maximum and minimum supply voltage, output current drive, and other similar parameters.

In step 2, an engineer creates a circuit design that presumably will meet the circuit specification. This circuit design may include transistors, resistors, capacitors, and other electronic components. The engineer uses these electronic components as building blocks of the design, interconnecting them to achieve the desired functionality and performance. The engineer may make a custom design using electronic component building blocks or use a gate array, where the building blocks are a set of cells set by the gate array manufacturer. The design may be input using a graphical design tool such as schematic capture program, and any other design tool may be used. The circuit may be described using a high-level design language (HDL). These design tools will create a netlist (step 3) of the circuitry, which is a listing of the components of the devices and their interconnections.

During the design phase, the engineer simulates the performance and verifies the functionality of the circuitry (step 4). There are transistor and process models to model the components. Some simulation tools include Spice, which performs circuit simulation, and Verilog, which performs functional and timing verification. This is where the electrical information for current density routing is generated.

After deciding upon an initial circuit design, the engineer begins layout (step 5) of the circuitry. Layout refers to making the three-dimensional dispositions of the element and interconnections to make an integrated circuit. Making an integrated circuit is a layer by layer process. Some layers of an integrated circuit are diffusion, polysilicon, metal-1, metal-2, contact, via, and others. There may be multiple layers of the same material, but on different layers. For example, diffusion and polysilicon layers are used to make MOS transistors (step 5a). For example, metal-1 and metal-2 are two different layers, where metal-1 is below the metal-2 layer. These metal layers may be connected together using a via. Metal is typically used for interconnections (step 5b) and supplying power and ground to the devices.

Software tools may be used to help with the layout of the circuit, such as the automatic routing of interconnect (steps 5b and 5c). The interconnect may be between devices. Devices and circuitry may be grouped into blocks or cells having inputs and outputs. The interconnect may be between these blocks or cells (step 5b).

In step 6, after or while the layout is generated, the physical design is verified and design is checked. For example, some of operations may include layout-versus-schematic (LVS) checking, electrical rule checking (ERC), design rule checking (DRC), layout simulation (especially for analog circuitry), power analysis, and timing analysis. Physical verification and design checking is often iterative. Based on the design check, a design engineer or user may make changes to the design or layout, or both and the design may be rechecked in order to make sure any areas of concern or design errors have been cleared.

The result of layout is data (e.g., provided in GDSII format or other format) that is used to make the masks (step 7). The masks are used to fabricate the integrated circuit (step 7) using a photolithography process. Typically, there are many "copies" of the same integrated circuit fabricated on the same wafer. Each integrated circuit is a "die" on the wafer. Good dies are separated from the bad dies. The good dies are sawed and packaged. Packaging generally includes encapsulating the die in plastic or other material, and connecting pads of the integrated circuit to pins of the package, where the integrated circuit can be interfaced.

The invention provides techniques to automatically route nets in spine areas. The invention would help with steps 5b and 5c (routing interconnect) of the design process.

Figure 4:
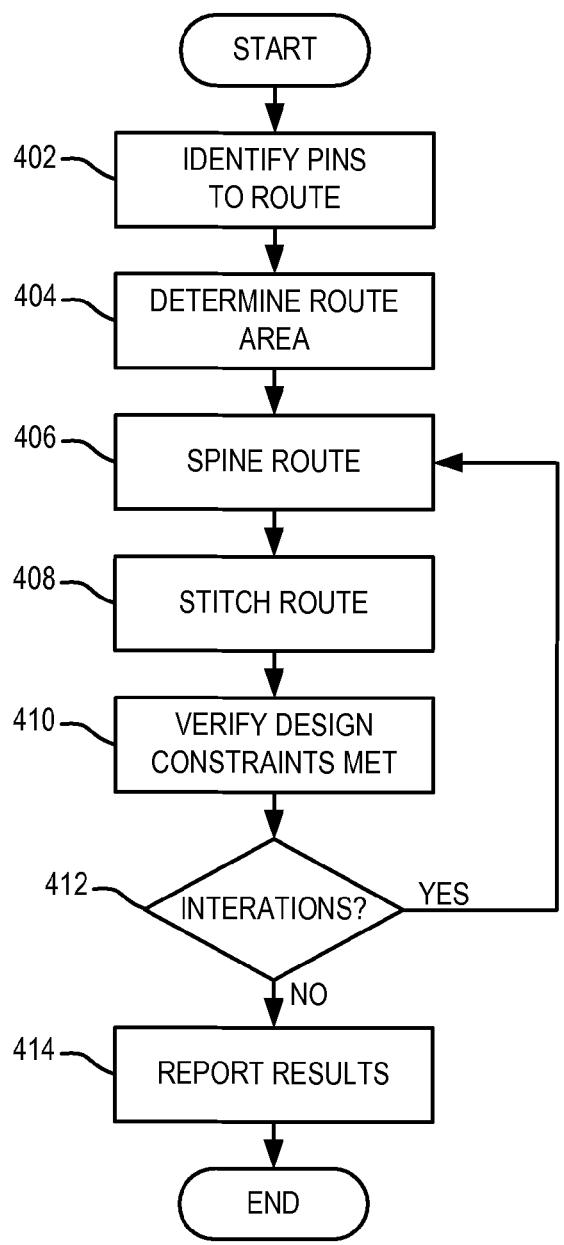
FIG. 4 shows a simplified flow diagram of routing interconnects according to an embodiment of the invention.

FIG. 4 shows a simplified flow diagram of routing interconnects according to an embodiment of the invention. In step 402, the system identifies the pins on a net to be routed. In one embodiment, a netlist can be used to identify the pins. Alternatively, a user can individually select pins to designate the net. Based on the disclosure and teachings provided herein, a person of ordinary skill in the art will appreciate how to implement to identify pins on a net. The system, in step 404, determines a route area which bounds the pins on the net. In one embodiment, the longer direction of the route area extends from the two most oppositely disposed pins on the net in the long direction of the spine.

A spine is a routing area that is long and relatively thin. It may also be referred to as a high aspect ratio routing area, where for example, the aspect ratio between length and width is 4:1 or greater. For example, the length to width ratio may be 4.5:1, 5:1, 6:1, 7:1, 8:1, 10:1, 12:1, 16:1, or even greater. An example of a routing area with a high aspect ratio is an area found between peripheral logic devices of memory array blocks in memory devices or devices with embedded memory. Another example of a routing area with a high aspect ratio is an area found in datapath design, such as in an arithmetic logic unit (ALU) or floating point processing unit (FPU) or a processor or embedded processor. Datapath designs will have these high aspect area routing areas as the number of width of the processor increase, such as 64-bit processors, 128-bit processors, and so forth.

Next, in step 406, the system routes a spine interconnect, that extends the length of the route area in the long direction of the spine. The placement of the spine interconnect with respect to the direction orthogonal to the long direction is determined as to avoid any obstacle and minimize the average length of stitching interconnects. In step 408, stitching interconnects are routed from pins to the spine interconnect. Stitching interconnects run directly in direction orthogonal to the long direction to minimize interconnect length, unless the stitching interconnects is required to take one or more detours to avoid an obstacle or satisfy a design constraint (such resistance, capacitance, or timing constraints).

The system as shown in step 410 verifies that the computed routing satisfies design constraints. In one embodiment, the system may change the spacing, length, or path of the interconnects so as to satisfy a design constraint. Instances where a design constraint is not satisfied is an error. In decision block 412, if further iterations of the routing are specified, the system reroutes the spine and stitching interconnections to eliminate or reduce errors. The number of iterations can be directly specified by the user (for example, one, two, five, twenty, or more iterations) or determined by an algorithm (for example, iterations continue until a best solution is found as determined by the number of errors, shortest average length of interconnects, or lowest cost). In step 414, the system reports the results of the routing. Reporting results can take many forms, such as outputting the routed net to a screen 5 or printer device, or saving data to a file for a design automation tool.

TABLE B

```
# A pseudo code description of a spine router
FOR channel IN channels
{
  net_list = process_net_list( channel );
  FOR net IN net_list
  {
    channel_route_net( net );
  }
}
process_net_list( channel )
{
  FOR net IN channel
  {
    net.ideal_position = calculate_ideal_position( net );
    net.channel_rectangle = calculate_channel_rectangle( net ) ;
    add_to_net_list( net );
  }
  return net_list;
}
# The ideal position for a net is calculated to be the position that will
# result in the minimum amount of stitch routing.
# The channel rectangle for a net is the intersection of the rectangle that
# encompasses the items on the net and the rectangle of the channel itself.
channel_route_net( net )
{
  site_list = create_initial_sites( net ) ;
  WHILE length( site_list ) > 0
  {
    current_site = next_entry( site_list );
    obstacle = find_obstacle_overlapping_current_site( ) ;
    IF ! obstacle BREAK;
    new_sites = split_site_around_obstacle( obstacle );
    add_sites_to_list( new_sites ) ;
  }
  IF length( site_list ) > 0
  {
    current_site = next_entry( site_list );
    create_net_channel_routing( current_site ) ;
  }
}
# create_initial_sites(net)
# Creates a site whose rectangle is net.channel_rectangle for each layer
in the channel .
# split_site_around_obstacle(obstacle)
# Creates two new sites either side of the original site as long as the
# new sites are wide enough to fit the channel routing.
# add_sites_to_list
# Sites added to the list are ordered by cost. The cheapest cost site being
first in the list.
# The cost is calculated using the distance of the site from the ideal
position for that net.
# An extra cost is added to account for the number of via that would need
# to be used to stitch the channel to the pins on the net.
# create_net_channel_routing( current_site )
# Creates the routing wire (or spine interconnect) for the net as close as
# possible to the net's ideal position as the site will allow.

```

TABLE B-continued

Note wires created become obstacles to subsequent nets along with
existing database obstacles.

Figure 5A:
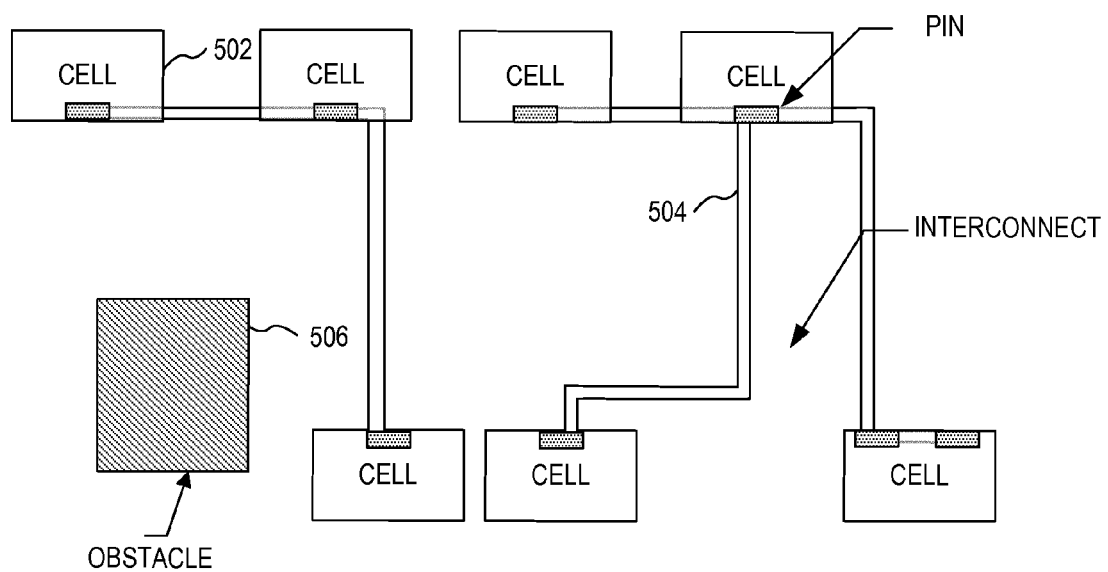
FIGS. 5(a) and 5(b) illustrate examples of interconnect routing by a traditional router and a router according to an embodiment of the invention, respectively.
Figure 5B:
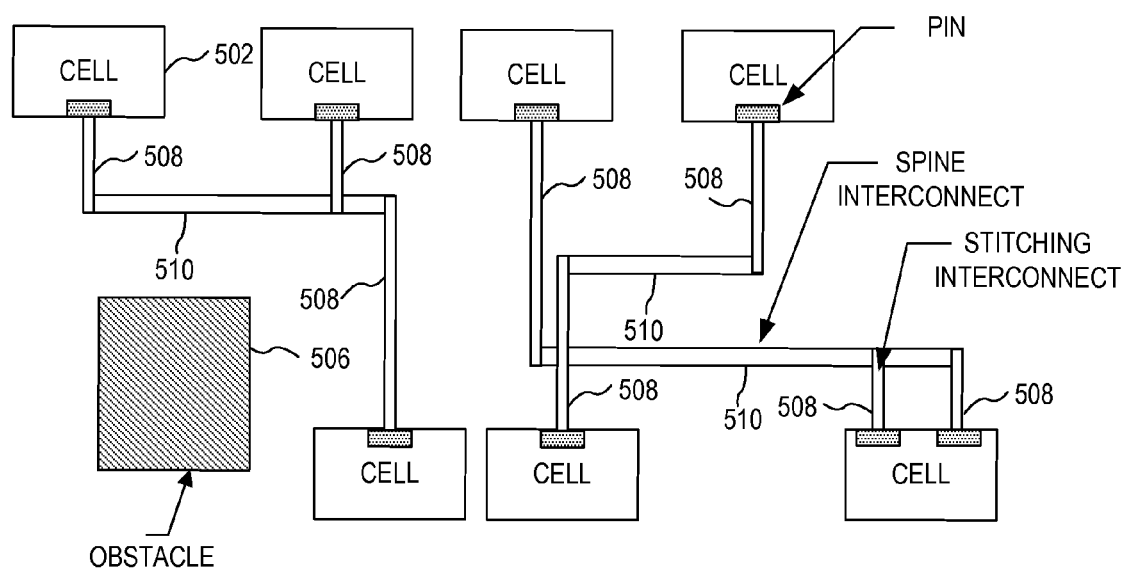

FIGS. 5(a) and 5(b) illustrates, by way of a simple example, some of the differences of interconnect routing performed by a traditional router and a router according to embodiment of the present invention (a "spine router"). FIG. 5(a) shows a minimal routing pattern to connect each net produced by a traditional router.

As shown in FIG. 5(b), the spine router places a shared minimal linear spine interconnect at a calculated position in the spine region (i.e., the vertical direction in FIG. 5(b)) for each net. For example, for each net, the spine router places spine interconnect 510 in the spine region. The position of spine interconnect 510 in the spine region is calculated to provide the shortest average length of a net's interconnects from its pins to the spine interconnect, or stitching interconnects. As a consequence, spine interconnect placement in the vertical direction is weighted to the side where there are more net pins. In our example, spine interconnect 510 is placed in the spine region to reduce the average length of stitching interconnects 508 for each net. Likewise, the length of each spine interconnect 510 along the direction of the spine, or priority direction, is the minimal length to provide for a straight, perpendicular stitching interconnects 508. Even so, it may not be always possible to route a stitching interconnect that is a straight, perpendicular interconnect. In some instances, a stitching interconnect may need to be routed with a minimum jog to avoid an obstacle 506 (such as, a cell, pin, or area outside a user designated design area).

FIGS. 6(a), 6(b), 6(c), and 6(d) illustrate the process of automatically routing a spine design according to an embodiment of the present invention. In this simple example, the spine router must identify pins of the net and define a route area within the spine region. It must also identify an obstacle (e.g., an area on specific layers that presents a restriction to routing or placement) and define the resulting forbidden area. Once the spine router has defined the route area and the forbidden area, it can route a spine interconnect and stitching interconnects.

Figure 6A:
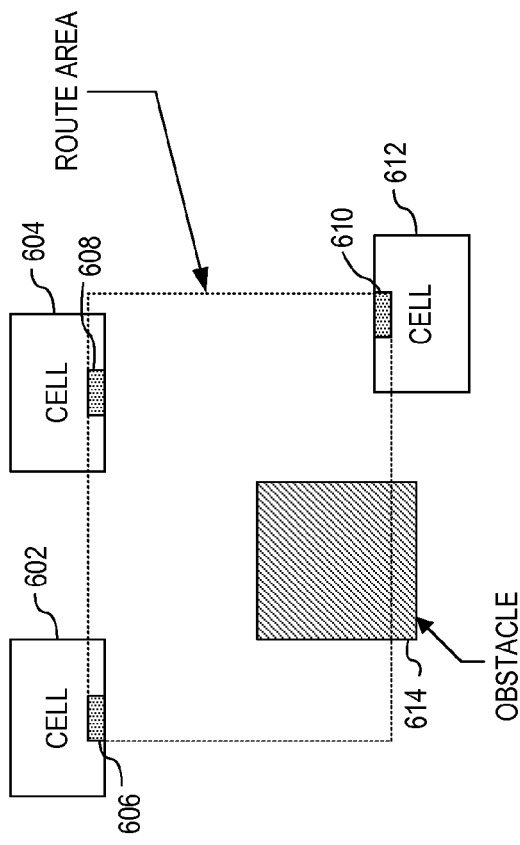
Figure 6B:
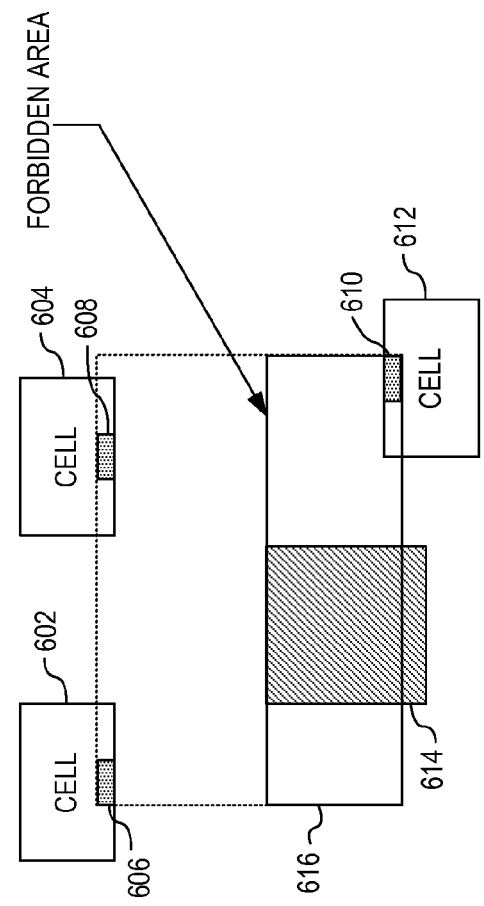

First, in this example, the spine router reviews a netlist, which specifies that pins 606, 608, and 610 of cells 602, 604, and 612, respectively, are to be connected. In FIG. 6(a), the router defines a route area 611 that encompasses pins 606, 608, and 610 and extends in the longwise direction, or priority direction, of the spine area from the two farthest apart pins, pins 606 and 610. Route areas are rectangular due to the desired orthogonality of spine interconnects and stitching interconnects. Next, the spine route identifies obstacle 614 within the route area 611. As seen in FIG. 6(b), the spine router defines a forbidden area 616 that encompasses obstacle 614 and expands the entire length of the route area 611 in the priority direction. The spine router will exclude forbidden area 616 for placement of a spine interconnect. Due to obstacle 614, any spine interconnect placed in a forbidden area 616 would fail to span across the entire route area.

FIG. 6(c) illustrates placement of a spine interconnect 618 in route area 611. The spine interconnect should span the entire length of the route area in the priority direction to facilitate orthogonal stitching interconnects from pins 606, 608, and 610 to spine interconnect 618. Placement of spine interconnect 618 in a direction secondary direction (i.e., direction orthogonal to the priority direction) may be at any location outside the forbidden area 616. It is desirable for the spine to not have breaks (such as using vias and contacts to utilize different conductor layers), bends, or jogs, as would happen with routing with a traditional router, because such a straight spine provides better signal propagation. Therefore, the automated routing technique of the invention provides improved routing quality.

In an embodiment of the present direction, the spine router routes spine interconnect 618 to minimize the average length of stitching interconnects for the net. Minimized interconnects provide reduced signal delays for improved timing performance, reduced occupied surface area for smaller device package size, and reduced resistances for less device power consumption. The spine router calculates the average position in the secondary direction of pins 606, 608, and 610. If the calculated position falls outside forbidden area 616, a spine interconnect 618 can be routed at that location. Otherwise, the spine interconnect 618 can be routed at the closest location to the calculated position which is outside of forbidden area 616.

In our relatively simple example, the calculated position of spine interconnect 618 is, from the top of the spine, one-third the width of the spine. The position reflects the weighting of two pins at the top of the spine against the one pin at the bottom of the spine. In more complex examples with N pins on a net, the calculated position of the spine interconnect in the secondary direction can be described by the expression $(X_1+X_2+\ldots+X_N)/N$ where $X_i$ is the position of a pin i in the secondary direction. In an alternative implementation, the calculated position of the spine interconnect in the secondary direction can be, or be about, the modal position of the pins on the net, or the position in the second direction that contains more individual pins of the net than any position.

There are many different techniques to place or position the spine interconnect so that it improves routing quality, and any of these techniques may be used. For example, some techniques consider an average or weighted average position, so that the spine is positioned closer to where there are more number of pins. Other techniques involve taking into consideration the modality. The highest mode is a position where there are the greatest number of pins in one place. Still further techniques take into consideration, not necessarily the highest mode, but the significant places where there are a large number of pins. A technique is to determine a spine position where the stitch connectors will line up to provide good route quality.

In FIG. 6(d), the spine router routes stitching interconnects 620 to connect pins 606, 608, and 610 to spine interconnect 618. In order to minimize interconnect length, stitching interconnects 620 are routed as straight lines directly to, and orthogonally with, spine interconnect 618. Pins 606, 608, and 610 are now connected as a net.

Figure 7:
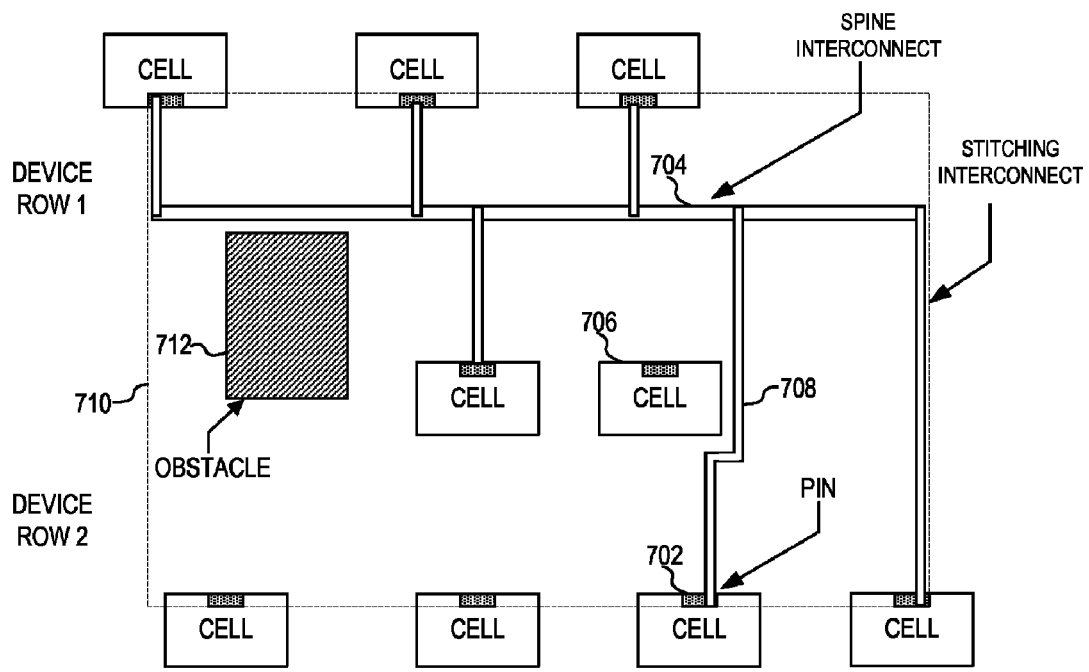
FIG. 7 shows, as an example, interconnect routing of a multiple device row design according to an embodiment of the invention.

However, when routing multidevice row nets, it may not always be possible to route a stitching interconnect as a straight line due to an obstacle (e.g., cell, pin, and others) in the path. In such circumstance, the spine router determines the least expensive deviation from the straight path based on a cost function. By and large, the resulting deviation will be a minimum jog to avoid the obstacle. As shown in the example of FIG. 7, the straight path from pin 702 to spine interconnect 704 is blocked by cell 706. According to an embodiment of the present invention, the spine router can route the stitching interconnect 708 with a minimum jog to get around cell 706. This minimum jog can be determined by a cost function based on numerous factors, including length of interconnect, capacitance of interconnect, and others.

FIG. 7 also illustrates that, other than stitching interconnect deviations, the spine router uses the same techniques for multidevice row routing as with single device row routing. For example, in FIG. 7, the spine router defines a rectangular route area 710 that encompasses all the pins to a net. Next, it identifies obstacle 712 and defines a forbidden area (not shown). The spine router calculates a trench interconnect position in the secondary direction based on the average position of the pins of the net. In this example, the calculated position falls within the forbidden area and, therefore, spine interconnect 704 is placed at the closest location in the secondary direction of the calculated position. From this example, it can be seen that techniques of the present invention can be applied to routing nets over 1, 2, 3, 5, 10, 20, or more spine areas.

In an embodiment of the invention, the spine router can automatically route one or more shields for designated spine interconnect. A shield is piece of metal neighboring, surrounding, or nearly surrounding an interconnect being shield to reduce the stray capacitances. Although typically at ground potential, a shield can be any predetermined potential with respect to ground. The spine router routes the shield with the same routing pattern as the spine interconnect separated by a small distance. In one embodiment of the present invention, this distance for each shield is calculated to be the minimum design rule checking spacing, or distance satisfying all design constraints, for such shield.

The shield is adjacent to the spine interconnect at either side or, alternatively, above or below. Exemplary shield configurations are shown in FIGS. 8(a), 8(b), and 8(c). FIG. 8(a) shows a pair of shields 804 on each side of an interconnect 802. FIGS. 8(b) shows a pair of shields 808 above and below interconnect 806. FIG. 8(c) shows an interconnect 810 surrounded on four sides by shields 812. FIG. 8(d) shows an alternative embodiment using four shields 816 to surround interconnect 814. Additional shield configurations can be fashioned using 1, 2, 3, 4, or more shields per interconnect. In an alternative embodiment, the spine router may automatically route a shield with a separation distance below a specified design constraint if insufficient physical space is available. In yet another embodiment, the spine router can also shield a stitching interconnect using the same techniques.

Figure 9A:
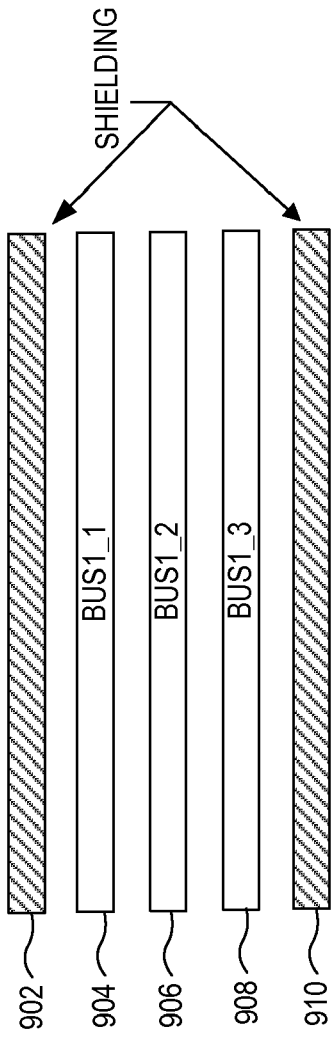
FIGS. 9(a) and 9(b) show exemplary embodiments of automatic routing of shielding for bus interconnects.
Figure 9B:
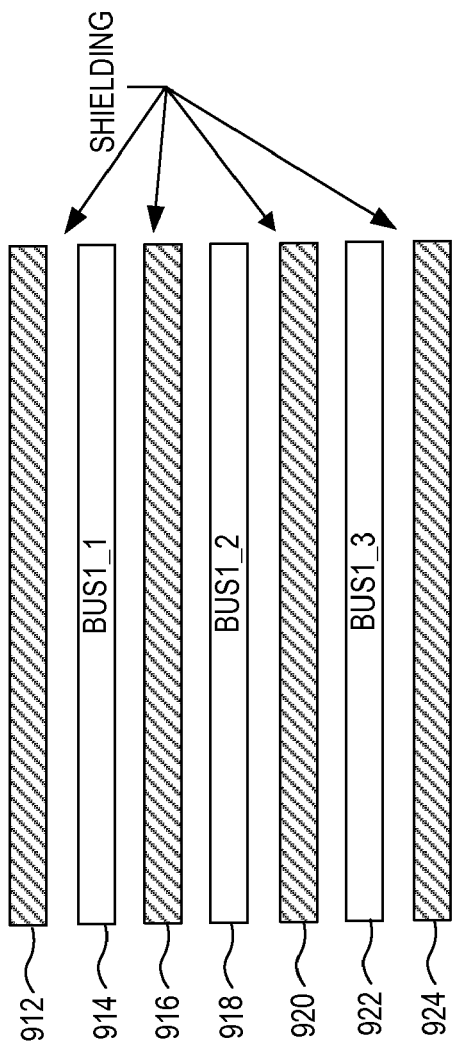

In an embodiment of the invention, a spine router can route a bus. A bus is a set of nets that use the same routing pattern. Bus routing is typically used for address, datapath, and other timing-critical nets to ensure that all bits in the bus have very similar delay characteristics. FIGS. 9(a) and 9(b) show exemplary embodiments of automatic routing of shielding for bus interconnects. In this example, the bus includes bus interconnects 904, 906, and 908. The spine router automatically places shields 902 and 910 on each side of the bus. In one embodiment, shields 902 and 910 follow alongside the path of the bus when it travels in the priority direction of the spine, or the spine interconnects of the bus. In an alternative embodiment, shields 902 and 910 can be routed alongside the entire path of the bus. The spine router can also automatically interleave shields and bus interconnects. As illustrated in FIG. 9(b), shields 912, 916, 920, and 924 are routed to interleave each of the bus interconnects 914, 918, and 922.

In an embodiment of the present invention, the spine router can automatically interleave a plurality of buses. Buses are interleaved to ensure that all bits in the two buses have very similar delay characteristics. FIGS. 10(a) and 10(b) illustrate automatic interleaving of bus interconnects according to an embodiment of the invention. As illustrated in FIG. 10(a) bus 1 includes bus interconnects 1002, 1004, and 1006, and bus 2 includes bus interconnects 1008, 1010, and 1012. The spine router can reroute bus 1 and bus 2 to interleave each bus interconnect of the two buses as shown in FIG. 10(b).

As the spine region can contain blockages (such cells and interconnects), spine interconnects can be routed using layer jumpers. For example, an embodiment of the present invention, spine interconnects can use layer jumpers to cross overlapping spine regions and hence overlapping spine interconnects in the same layer. A lower priority spine interconnect is moved onto a different layer, typically the stitching layer, for a small distance to cross over a higher region priority spine interconnect.

Figure 11:
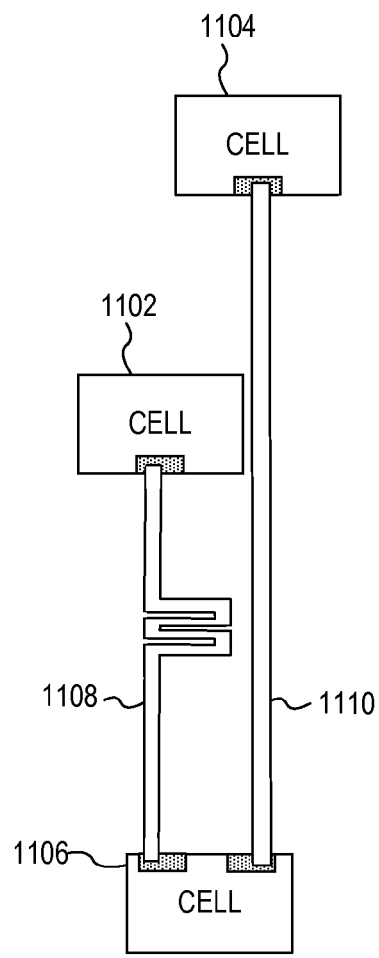
FIG. 11 illustrates automatic interconnect routing with time-based constraint matching.

In an embodiment of the present invention, the spine router can route a plurality of interconnects to match length, resistance, or timing. The spine router can perform constraint matching by adjusting: interconnect length, neighboring interconnect spacing, or a combination thereof. For example, the spine router can automatically lengthen a shorter net (such as by jogging an interconnect) to increase its length. FIG. 11 is a simple example of time-based constraint matching. If the time delay for a signal from cell 1102 to cell 1106 and cell 1104 to cell 1106 are constrained to be approximately the same, the spine router can automatically increase the length of interconnect 1108 to match the length of interconnect 1110. In more complex designs, the spine router can alternatively, or in combination, adjust the distance between neighboring interconnects to reduce stray capacitances, and thus improve time performance. Without time constraint matching, nets will inherently have different lengths, and therefore timing, due to the orthogonal nature of the spine, spine interconnects, stitching interconnects, and pin locations.

Figure 12:
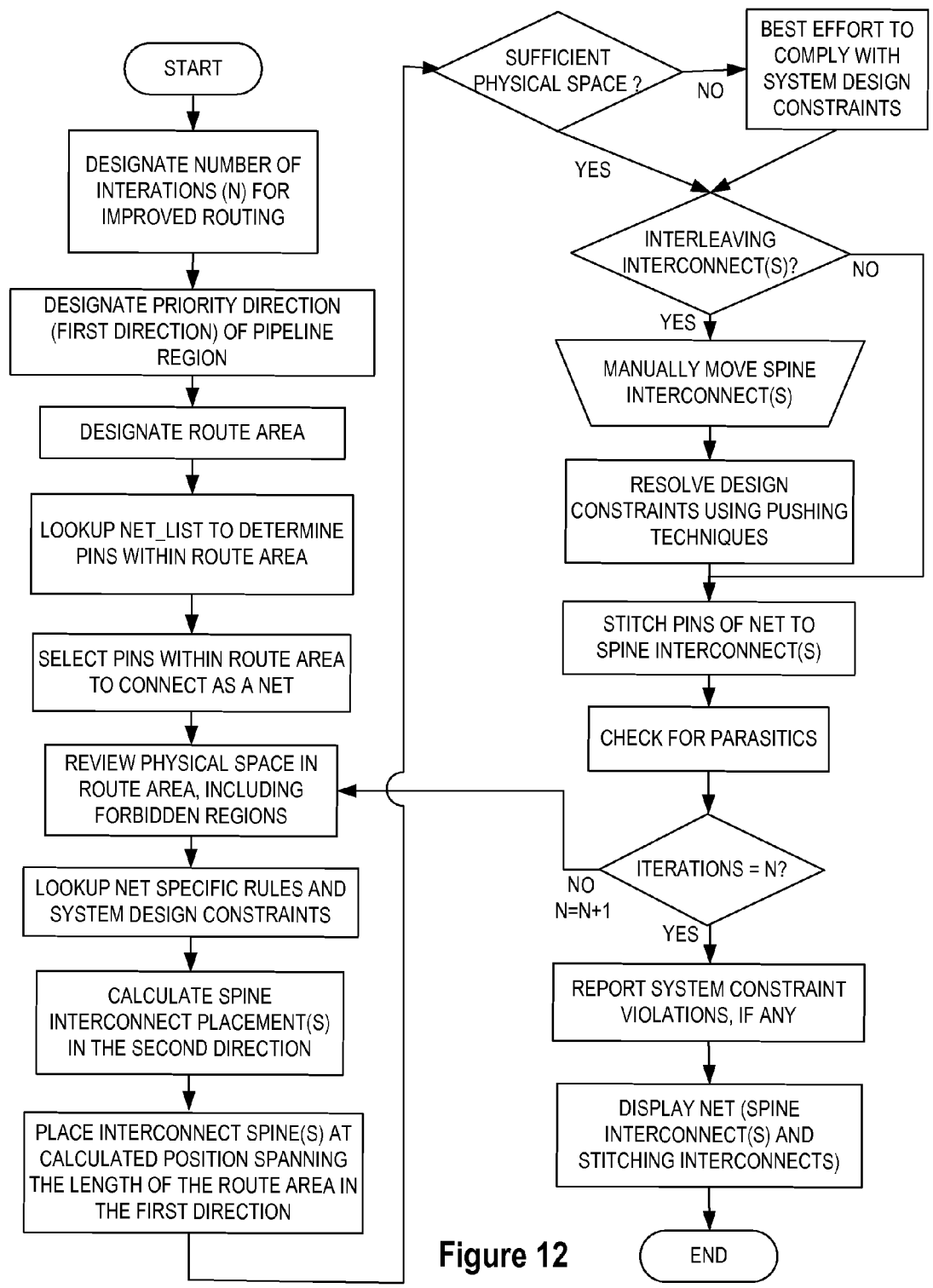
FIG. 12 shows a flowchart of routing interconnects according to an embodiment of the invention.

FIG. 12 shows a simplified flow diagram of routing interconnects according to an embodiment of the invention. The steps described in FIG. 12 are general steps that may be applied to routing interconnects in a spine region. The steps include receiving inputs, such as a number of iterations to be performed for improved interconnect placement, priority direction of spine region, and pins from netlist. Next, the spine router reviews the physical space in the spine regions, design constraints, and pin positions to determine spine and stitching interconnect placements. Interconnect routes can be adjusted by a user after routing. For example, as shown in FIG. 12, spine interconnects can be interleaved, which may involve manually moving the spine interconnects, or automatically interleaving the interconnects. The next step is to review the routing against design constraints, such as parasitics. If iterations are specified, the spine router can reroute interconnects to satisfy design constraints or improve performance. The spine router next displays the net and reports any design constraint violations. There may be additional or other steps, which may replace one or more above steps. Certain steps may be repeated. For example, additional steps may be included to automatically route shielding or match signal timing for specified interconnects.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Additionally, although the present invention has been described using a particular series of transactions and steps, it should be apparent to those skilled in the art that the scope of the present invention is not limited to the described series of transactions and steps.

Further, while the present invention has been described using a particular combination of hardware and software, it should be recognized that other combinations of hardware and software are also within the scope of the present invention. The present invention may be implemented only in hardware, or only in software, or using combinations thereof.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

The invention claimed is:

1. A method for routing at least one interconnect of an integrated circuit comprising:
   identifying at least two pins to couple;
   by using a computer, calculating a route area having a boundary so that the at least two pins touch the boundary, wherein the route area has a rectangular shape and is bounded by a first, second, third, and fourth side, the third side is opposite of the first side, the fourth side is opposite of the second side, the first side is longer than the second side, the first and third sides extend in a first direction, the second and fourth sides extend in a second direction, and the second direction is orthogonal to the first direction;
   routing a spine interconnect extending in the first direction at least a length from a first pin to a second pin in the first direction; and
   routing a plurality of stitching interconnects in the second direction to couple the first pin and second pin to the spine interconnect.

2. The method of claim 1 wherein the route area in the second direction extends between the most oppositely disposed in the second direction of the at least two pins.

3. The method of claim 1 further comprising determining a position in the second direction for the spine interconnect to reduce an average length of the plurality of stitching interconnects.

4. The method of claim 3 wherein the position of the spine interconnect in the second direction is a weighted average of positions in the second direction of the at least two pins.

5. The method of claim 1 further comprising:
   determining if at least one forbidden area is located within the route area, the at least one forbidden area extends in the first direction the entire length of the route area in the first direction and comprises at least one obstacle,
   wherein routing the spine interconnect excludes the at least one forbidden area.

6. The method of claim 5 wherein the position of the spine interconnect in the second direction is a closest available position outside the at least one forbidden area to a weighted average of positions in the second direction of the at least two pins positions.

7. The method of claim 5 further comprising determining if a path of each of the plurality of stitching interconnects is unobstructed by the at least one obstacle.

8. The method of claim 1 wherein an edge of the route area being an edge of a chip, the edge of the chip includes one of the at least one pins.

9. The method of claim 1 further comprising automatically routing at least one shield parallel to the spine interconnect.

10. The method of claim 9 wherein the at least one shield comprises two shields disposed on opposite sides of the spine interconnect.

11. The method of claim 9 wherein the at least one shield is coupled to a ground potential.

12. A method for routing a plurality of nets of an integrated circuit comprising:
   identifying pins to couple for each net;
   by using a computer, calculating a route area for each net to comprise positions in a first direction of the pins for such net, wherein a boundary of the route area comprises at least a first side and a second side, the first side is opposite of the second side, and each of the pins touches the first or second side;
   determining for each route area if at least one forbidden area is located within the route area;
   routing outside of the at least one forbidden area a plurality of spine interconnects extending in a first direction the entire length of each corresponding route area in the first direction; and
   routing a plurality of stitching interconnects in a second direction to couple each of the pins to the corresponding spine interconnect,
   wherein the at least one forbidden area being an area to include at least one obstacle and extending in the first direction an entire length of the corresponding route area in the first direction.

13. The method of claim 12 further comprising automatically routing the plurality of spine interconnects to be spaced to satisfy a design constraint.

14. The method of claim 13 wherein the design constraint comprises at least one of spacing, crosstalk, capacitance, or timing.

15. The method of claim 12 further comprising automatically routing a first interconnect to match a timing delay of a second interconnect by lengthening the first interconnect.

16. The method of claim 12 further comprising automatically routing a first interconnect to match a timing delay of a second interconnect by increasing the spacing between the first interconnect and a third interconnect.

17. A method of routing at least one interconnect of an integrated circuit comprising:
   by using a computer, identifying at least two pins to couple, wherein each pin has a position in a first direction and a position in a second direction, orthogonal to the first direction;
   calculating a route area having a boundary, the route area extending a distance in the first direction to comprise positions in the first direction of the at least two pins, wherein the at least two pins are on the boundary of the route area;
   determining if at least one forbidden area is located within the route area, wherein the at least one forbidden area extends in the first direction the entire length of the route area in the first direction and comprises at least one obstacle;
   routing a spine interconnect extending in the first direction at least a length from a first pin to a second pin in the first direction, wherein the spine interconnect is placed outside of the at least one forbidden area; and
   routing a plurality of stitching interconnects in the second direction to couple the first pin and second pin to the spine interconnect,
   wherein a position in the second direction of the spine interconnect is at an available position, outside the at least one forbidden area, based on a function of the at least two pins.

18. The method of claim 17 wherein the function comprises a quotient of a sum of positions of the pins in the second direction and a total number of the at least two pins.

19. The method of claim 17 wherein the function comprises a weighted average of positions in the second direction of the at least two pins.

20. The method of claim 17 wherein the available position is at a position not occupied by another spine interconnect.

21. The method of claim 1 wherein the at least two pins touch at least the first or third sides.

22. The method of claim 1 wherein the routing a spine interconnect extending in the first direction at least a length from a first pin to a second pin in the first direction is replaced by routing a spine interconnect extending in the first direction at least a length of the first side in the first direction.

23. The method of claim 1 wherein the route area comprises the spine interconnect and the plurality of stitching interconnects.

24. The method of claim 12 wherein the route area has a trapezoid shape.

25. The method of claim 12 wherein the route area has a rectangle shape.

26. The method of claim 12 wherein a length of the spine interconnects have a length at least equal to a length of the first side.

27. The method of claim 12 wherein the route area comprises the spine interconnect and the plurality of stitching interconnects.

28. The method of claim 17 wherein the boundary of the route area comprises a first in the first direction, second in the second direction, third in the first direction, and fourth side in the second direction, the third side is opposite of the first side, the fourth side is opposite of the second side, and the first side is longer than the second side.

29. The method of claim 28 wherein the at least two pins are on at least the first side or the third side.

30. The method of claim 28 wherein the entire length of the route area is equal to a length of the first side.

31. The method of claim 17 wherein the routing a spine interconnect extending in the first direction at least a length from a first pin to a second pin in the first direction, wherein the spine interconnect is placed outside of the at least one forbidden area is replaced by routing a spine interconnect extending in the first direction at least the entire length of the route area, wherein the spine interconnect is placed outside of the at least one forbidden area.

32. The method of claim 17 wherein the route area comprises the spine interconnect and stitching interconnects.

* * * * *